United States Patent
Ten Dolle et al.

(10) Patent No.: US 7,119,615 B2
(45) Date of Patent: Oct. 10, 2006

(54) ELECTRONIC AMPLIFIER CIRCUIT

(75) Inventors: Hendrik Klaas Jan Ten Dolle, Nijmegen (NL); Marcel Henricus Wilhelmus Van De Westerlo, Nijmegen (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 29 days.

(21) Appl. No.: 10/511,365

(22) PCT Filed: Apr. 1, 2003

(86) PCT No.: PCT/IB03/01267

§ 371 (c)(1),
(2), (4) Date: Oct. 14, 2004

(87) PCT Pub. No.: WO03/090345

PCT Pub. Date: Oct. 30, 2003

(65) Prior Publication Data

US 2005/0140440 A1    Jun. 30, 2005

(30) Foreign Application Priority Data

Apr. 19, 2002    (EP)    .................................. 02076546

(51) Int. Cl.
*H03F 3/45*    (2006.01)
(52) U.S. Cl. ..................................................... 330/252
(58) Field of Classification Search ........ 330/252–260, 330/301, 311
See application file for complete search history.

(56) References Cited

U.S. PATENT DOCUMENTS

| 3,938,055 A | 2/1976 | Buhler |
| 6,515,547 B1 * | 2/2003 | Sowlati ....................... 330/311 |
| 2005/0110555 A1 * | 5/2005 | Nakatani et al. ............ 327/359 |

OTHER PUBLICATIONS

Differential Amplifier, by O.R. Buhler, IBM Technical Disclosure Bulletin, vol. 13, No. 12, May 1971, p. 3717.

* cited by examiner

*Primary Examiner*—Robert Pascal
*Assistant Examiner*—Hieu Nguyen
(74) *Attorney, Agent, or Firm*—Aaron Waxler; Paul Im

(57) ABSTRACT

An amplifier circuit contains a first and second current branch, each branch comprising an input transistor and a cascode transistor. Inputs of the amplifier are coupled to control electrodes of the input transistors in respective ones of the current branches. The control electrodes of the cascode transistors are coupled to each other. A high frequency coupling is provided between the control electrodes of the cascode transistors and a node of the common current source, to copy substantially common mode voltage changes of terminals of the main current channels of the input transistors to voltage changes at the control electrodes of the cascode transistors. Thus, changes in the voltage difference between the voltages at the different terminals of each input transistor are substantially eliminated, preventing parasitic currents from the control electrode of the input transistor to the main current channel of the cascode transistors, that would reduce the common mode rejection ratio and thereby linearity of the amplifier.

5 Claims, 2 Drawing Sheets

ELECTRONIC AMPLIFIER CIRCUIT

The invention relates to an electronic amplifier circuit.

PCT patent application WO 01/26216 discloses a differential amplifier circuit. This amplifier circuit has differential input connections and differential output connections. The amplifier circuit contains two branches, each with a series connection of the main current channels of an input transistor and a cascode transistor coupled between a common circuit and a respective one of the differential output connections. The differential input connections are coupled to the control electrodes of the input transistors in the two branches.

High demands are placed on the linearity of such an amplifier, when it is used as a broadband amplifier to amplify signals from a band that contains many signals of comparable strength, such as may television channels in a Cable TV signal. WO 01/26126 describes how the linearity can be improved by ensuring a high transconductance of the amplifier at high frequencies, through a coupling that places the input transistor and the cascode transistor in each branch in parallel at higher frequencies.

It has been found that the common mode rejection of broadband amplifiers is an important factor in determining the non-linearity. This is because the even order intermodulation products of differential signals generated by the transistors are common mode signals. These even order intermodulation products include second order intermodulation products, which are potentially the strongest intermodulation products and which are particularly relevant for distortion in broadband amplifiers. By maximizing the common mode rejection of the differential amplifier the contribution of these even order intermodulation products to the output is minimized.

Amongst others, it is an object of the invention to improve the linearity of the differential amplifier.

Amongst others, it is an object of the invention to increase the common mode rejection of the differential amplifier.

The amplifier according to the invention is set forth in claim 1. By providing a high frequency coupling between a common point of the branches and the control electrodes of the cascode transistors of the branches it is ensured that there is little or no common mode voltage difference between the terminals of the main current channel of each input transistor and its control electrode. As a result of this, the circuit eliminates the effect on the gain exerted by the capacitance between the control electrode of the input transistor in a branch and the node that connects the main current channels of the input transistor and the cascode transistor in that branch (mainly the Miller capacitance in case of bipolar input transistors). This increases common mode rejection and thereby increases linearity.

The common point of the branches is fed by a common current source circuit. This circuit supplies the currents to the branches in common. Ideally this common current source circuit should be a perfect current source, producing a current that is independent of the voltage across the current source circuit, at least in response to voltage changes in the amplified frequency band. But it has been found that the amplifier has good linearity even if the current source circuit has a behaviour that differs far from the behaviour of such a perfect current source.

An embodiment of the amplifier according to the invention comprises a DC bias supply circuit coupled to the control electrodes of the cascode transistors of the branches, the DC bias supply circuit comprising a high frequency blocking circuit. Thus, it is ensured that high frequency current to the cascode transistors has to flow to the control electrodes of these transistors, forcing the cascode transistors to minimize the common mode voltage differences over the input transistors.

These and other objects and advantageous aspects of the amplifier according to the invention will be described in more detail using the following figures.

Figure 1:
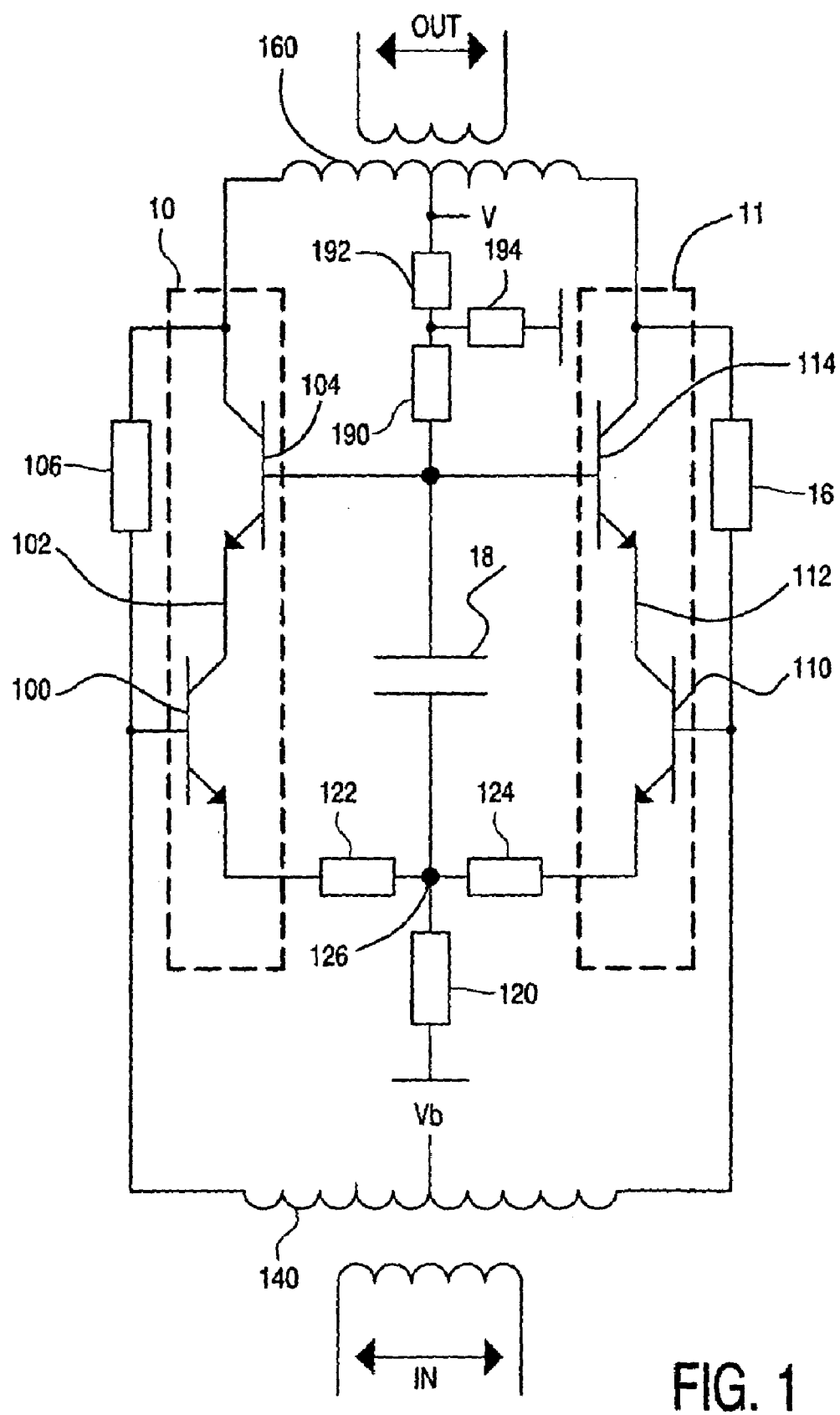
FIG. 1 shows a differential amplifier

FIG. 1 shows a differential amplifier. The amplifier contains two branches 10, 11. Each branch contains a series connection of the main current channels of an input transistor 100, 110 and a cascode transistor 104, 114 connected between a common circuit 120, 122, 124 and an output transformer 160. The control electrodes of the input transistors 100, 110 are coupled to an input transformer 140. Although symmetrical inputs and outputs are shown, it will be understood that usually one terminal of each of the input transformer and the output transformer is connected to ground, so as to create an asymmetric input and output. Preferably, the input transistors 100, 110 of both branches have substantially mutually equal parameters. Preferably also cascode transistors 104, 114 have substantially mutually equal parameters.

By way of example bipolar transistors 100, 104, 110, 114 are shown. The common circuit contains a common node 126, connected to the emitters of the input transistors 100, 110 via respective emitter resistances 122, 124 and to ground via a ground impedance 120. A power supply connection V is coupled to the collectors of the cascode transistors 104, 114. The control electrodes of the input transistors 100, 110 are biased with a base voltage Vb via the input transformer 140. Feedback impedances 106, 116 couple the outputs of the branches 10, 11 to the control electrodes of the input transistors 100, 110.

The control electrodes of the cascode transistors 104, 114 are coupled to each other. A capacitor 18 couples the common node 126 is connected to the control electrodes of the cascode transistors 104, 114. The control electrodes of the cascode transistors 104, 114 are biased via bias network 192, 194, 190.

In operation, an input voltage difference is applied between the control electrodes of the input transistors 100, 110 from input transformer 140. This results in a current difference between the currents flowing through the main current channels of the input transistors 100, 110. Common circuit 120, 122, 124 serves as a current source at least in the frequency range for which the amplifier is used. For this purpose, ground impedance 120 has a relatively high value, at least for higher frequencies. This may be realized by using an inductance in ground impedance 120, or by means of a current source circuit in ground impedance.

The currents from the common circuit 120, 122, 124 mainly flow from the main current channels of the input transistors 100, 110 through the main current channels of the cascode transistors 104, 114 to the output transformer 160. Cascode transistors 104, 114 serve to provide a low impedance at nodes 102, 112 in the branches 10, 11 between the main current channels of the input transistors 100, 110 and the cascode transistors 104, 114. This low impedance reduces undesirable feedback effects of the input transistors 100, 110. Feedback impedances 106, 116 are optionally used to adjust the frequency dependence of the amplifier gain and the input impedance at the control electrodes of the input transistors 100, 110, so as to provide a matched input impedance at the input of the amplifier. The difference between the currents leads to an output voltage at the output of the output transformer 160.

Because of the current source behaviour of the common circuit 120, 122, 124 the sum of the currents from the common circuit 120, 122, 124 to the main current channels in both branches 10, 11 is a constant independent of the input signal, at least in a frequency band of interest. Absent injection of further current from outside the branches 10, 11, all currents though the branches 10, 11 are proportional to these currents from the common circuit 120, 122, 124 and therefore the sum of any pair of corresponding currents from the branches 10, 11 is a constant independent of the input signal.

The currents from the common circuit 120, 122, 124 mainly flow from the main current channels of the input transistors 100, 110 through the main current channels of the cascode transistors 104, 114 to the output transformer 160. The difference between the currents leads to an output voltage at the output of the output transformer 160. Ideally, the common mode component (sum) of the currents cannot contribute to the output voltage if the output transformer 160 is ideally symmetric. This corresponds to an infinite common mode rejection ratio. But in practice, due to the inevitable asymmetries the common mode component may lead to an output signal.

Non-linearity, in particular second order intermodulation effects contribute to the output signal through the generation of a common mode component. This component differs significantly from zero only to the extent that input dependent common mode currents from other sources than the high impedance common circuit 120, 122, 124 flow into the branches 10, 11. A relevant current of this type is the common current through the base collector capacitance of the input transistors 100, 110.

Capacitor 18 serves to provide a high frequency coupling between the control electrodes of cascode transistors 104, 114 and common node 126 of common circuit 122, 124, 120. The value of capacitor 18 is selected at least so large that in the frequency band for which the amplifier is used the common mode voltage changes of the emitters of the input transistors 100, 110 are substantially copied to the control electrodes of the cascode transistors 104, 114. A surprisingly low capacitance value suffices for this purpose, because the impedance at the control electrodes of cascode transistors 104, 114 is relatively high. This makes it possible to integrate capacitance value in an integrated circuit.

As a result of capacitance 18 and the effect of cascode transistors 104, 114 the common mode voltage changes are also copied to the nodes 102, 112 between the main current channels of the cascode transistors 104, 114 and the input transistors 100, 110. Thus, the common mode part of the voltage at the collectors of the input transistors 100, 110 is substantially equal to the common mode part of the voltage at their emitters, which in turn is substantially equal to the common mode part of the voltage at the control electrodes of the input transistors 100, 110, because of the high impedance of the common ground impedance 120 at the relevant frequencies.

As a result of the equal common mode voltages substantially no common mode current flows through the base-collector capacitance of the input transistors 100, 110 (e.g. through the Miller capacitance). Effectively, the circuit creates a very high impedance circuit for common mode voltages at the control electrodes of the input transistors. As a result, the amplifier realizes a very high rejection for common mode voltages and intermodulation products are suppressed. (It should be noted that, as a result of capacitor 18 the common mode rejection ratio is very high even if the current source behaviour of common circuit 120, 122, 144 is far from perfect).

Figure 2:
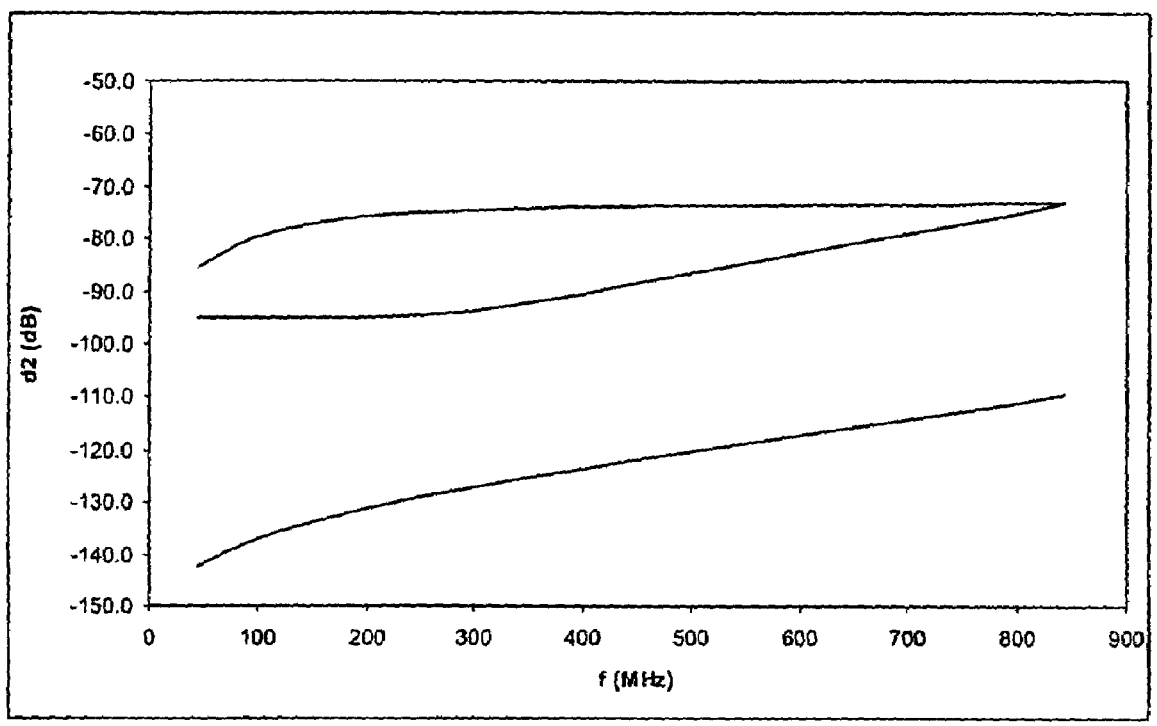
FIG. 2 shows non-linearity as a function of frequency

FIG. 2 shows a graph of the strength of second order distortion as a function of frequency. The strength is plotted on vertically on a logarithmic scale, to allow for comparison of strengths under different circumstances. A top curve shows distortion of the amplifier without capacitor 18. A second curve from above shows distortion with capacitor 18 added.

The effect of capacitor 18 can be improved by forcing substantially all current from common node 126 to flow through the control electrodes of cascode transistors. For this purpose, bias circuit 190, 192, 194 preferably contains an inductance 190 that presents a substantially higher impedance to signals at the relevant frequencies than the control electrode of cascode transistors 104, 114. A third curve from above in FIG. 2 show the strength of distortion when an inductance 190 has been added to the bias circuit when that inductance ideally blocks all relevant signal currents.

Although the principle of the invention has been illustrated using the circuit of FIG. 1, it will be appreciated that, without deviating from the invention many modifications may be made to the circuit. For example, part or all of the bipolar transistors 100, 104, 104, 114 may be replaced by field effect transistors. Each transistor may be realized by a parallel arrangement of a plurality of transistors. Such a parallel arrangement has the same effect as a single transistor, and, as used herein, is considerer to be covered by the word "transistor". Instead of transformers 160, 140 other circuits for feeding and/or extracting differential input and output signals may be used. Additional components may be added to the branches 10, 11, to the bias circuit 190, 192, 194 or the to the common circuit 122, 124, 120. Or components, for example emitter resistances 122, 124 may be deleted from the circuit.

Capacitor 18 may be replaced or supplemented by further capacitors between the control electrodes of cascode transistors 104, 114 and nodes in the common circuit 122, 124, 120 that substantially carry the variations of the emitter voltage of the input transistors 100, 110, so that a common mode voltage at the common circuit 120, 122, 124 is coupled to the control electrodes of common mode transistors 104, 114. For example a pair of capacitors (not shown) may be coupled from the control electrodes of the cascode transistors 104, 114 to the nodes between emitter resistors 122, 124 and input transistors 100, 110. In another example, T-shaped common circuit 120, 122, 124 may be replaced by a Pi shaped circuit, with impedances from the emitters to ground and an impedance between the emitters. In this case capacitors between the emitters of the input transistors 100, 110 and the control electrode of the cascode transistors 104, 114 may be used.

Also, although a simple capacitive coupling is preferred, it will be appreciated that any coupling that allows the common mode voltage from the common circuit 120, 122, 124 to be copied to the control electrodes of the cascode transistors 104, 114 in the frequency band of interest will achieve the desired effect of reducing distortion. In one alternative example, a buffer amplifier with a gain of substantially one may be used with an input coupled to a common point coupled to the emitters of the input transistors 100, 110 and an output coupled to the control electrode of cascode transistors 104, 114.

Emitter resistances 122, 124 are not essential for the effect of capacitor 18, but serve to adjust to the input impedances presented by the base the input transistors 100, 110 so as to match the impedance coupled to the input transformer, as well as to improve linearity. In one non-limitative example the emitter resistances have a value of 4 Ohm. Feedback impedances are not essential for the effect of capacitor 18 either, but serve to adjust the gain of the amplifier (in particular its frequency dependence) and to improve impedance matching. In one non-limitative example feedback impedances 106, 116 each contain a series arrangement of a capacitance in arrange of 100–10000 pF, an inductance in a range of 1–50 nH and a resistor in a range of 400 of 1500 Ohm. The capacitance serves as a DC-decoupling. The inductance serves to increase gain at higher frequencies. The resistor similarly serves to reduce the frequency dependent variation of the gain.

Thus, by adding a coupling between the common point on one hand and the control electrodes of cascode transistors 104, 114 common mode rejection and linearity of the differential amplifier are improved.

The invention claimed is:

1. An amplifier circuit comprising:
   input connections;
   a first and second current branch (10, 11), each comprising an input transistor (100, 110) and a cascode transistor (104, 114), the input connections being coupled to control electrodes of the input transistors (100, 110) in respective ones of the current branches (10, 11), control electrodes of the cascode transistors (104, 114) being coupled to each other;
   a common current source circuit (120, 122, 124);
   output connections, each coupled to the common current source circuit (120, 122, 124) via a series connection of the main current channels of the cascode transistor (104, 114) and the input transistor successively, of a respective one of the current branches;
   a high frequency coupling (18) between the control electrodes of the cascode transistors and a node of the common current source arranged to copy substantially common mode voltage changes of terminals of the main current channels of the input transistors to voltage changes at the control electrodes of the cascode transistors; and
   a bias circuit coupled to the control electrodes of the cascode transistors for biasing the control electrodes of the cascode transistors, the bias circuit comprising a high frequency current blocking circuit including an inductance for blocking flow of current from the high frequency coupling through the biasing circuit.

2. An amplifier circuit according to claim 1, wherein the high frequency coupling comprises a capacitance coupled between the control electrodes of the cascode transistors and the node of the common current source, with a capacitance value so that common mode voltage changes of the terminals of the main current channels of the input transistors are substantially coupled to voltage changes at the control electrodes of the cascode transistors.

3. A wide band high frequency signal distribution system, containing an amplifier according to claim 1.

4. An method of amplifying a wide band signal, the method comprising:
   inputting the wide band signal to a control electrode of input transistors in a first and second current branch, each current branch comprising one of the input transistors and a cascode transistor, the input connections being coupled to control electrodes of the input transistors in respective ones of the current branches, control electrodes of the cascode transistors being coupled to each other,
   outputting amplified signals from output connections that are coupled to a common current source circuit via a series connection of the main current channels of the cascode transistor and the input transistor successively, of a respective one of the current branches;
   copying substantially common mode voltage changes of terminals of the main current channels of the input transistors to voltage changes at the control electrodes of the cascode transistors, at least in a frequency band of the wide band signal;
   biasing the control electrodes of the cascode transistors with a bias circuit; and
   providing the bias circuit with a high frequency current blocking circuit including an inductance.

5. An amplifier circuit comprising:
   input connections;
   a first and second current branch, each comprising an input transistor and a cascode transistor, the input connections being coupled to control electrodes of the input transistors in respective ones of the current branches, control electrodes of the cascode transistors being coupled to each other;
   a common current source circuit;
   output connections, each coupled to the common current source circuit via a series connection of the main current channels of the cascode transistor and the input transistor successively, of a respective one of the current branches; and
   a high frequency coupling between the control electrodes of the cascode transistors and a node of the common current source arranged to copy substantially common mode voltage changes of terminals of the main current channels of the input transistors to voltage changes at the control electrodes of the cascode transistors;
   wherein a feedback impedance element is coupled between an output of at least one of the first and the second current branch and the control electrode of the responsive input transistor.

* * * * *